United States Patent [19]
van der Mast

[11] Patent Number: 4,823,013
[45] Date of Patent: Apr. 18, 1989

[54] CHARGED PARTICLES EXPOSURE APPARATUS HAVING AN OPTICALLY DEFORMABLE BEAM BOUNDING DIAPHRAGM

[75] Inventor: Karel D. van der Mast, Pijnacker, Netherlands

[73] Assignee: U.S. Philips Corp., New York, N.Y.

[21] Appl. No.: 89,092

[22] Filed: Aug. 25, 1987

[30] Foreign Application Priority Data

Aug. 29, 1986 [NL] Netherlands ............... 8602196

[51] Int. Cl.$^4$ ............................... H01J 3/12
[52] U.S. Cl. ................. 250/396 ML; 250/396 R; 250/492.2; 250/398
[58] Field of Search ......... 250/492.2, 492.22, 492.23, 250/396 R, 396 ML, 398

[56] References Cited

U.S. PATENT DOCUMENTS

| | | | |
|---|---|---|---|
| 4,075,488 | 2/1978 | Okzyzmz et al. | 250/396 R |
| 4,182,958 | 1/1980 | Goto et al. | 250/492.2 |
| 4,514,638 | 4/1985 | Lischke et al. | 250/492.2 |
| 4,560,878 | 12/1985 | Knaver et al. | 250/396 R |

Primary Examiner—Janice A. Howell
Assistant Examiner—John A. Miller
Attorney, Agent, or Firm—Robert J. Kraus

[57] ABSTRACT

In a beam shaper superpositions of a deformed first diaphragm and a deformed or non-deformed second diaphragm can be realized by means of a quadrupole system. As a result of this a great freedom for adapting the spot cross-section to the patterns to be formed is obtained, as a result of which the number of writing pulses per pattern and hence the writing time for, for example, a chip can be considerably reduced and in particular non-orthogonal and non-linear transistions in the patterns can be written with greater definition.

15 Claims, 3 Drawing Sheets

CHARGED PARTICLES EXPOSURE APPARATUS HAVING AN OPTICALLY DEFORMABLE BEAM BOUNDING DIAPHRAGM

BACKGROUND OF THE INVENTION

The invention relates to a charged particles apparatus having a particle source, a lens system and two beam-bounding diaphragms which are imageable one on the other and have therebetween a beam deflection system.

Such an apparatus is known from the article "Double-aperture method of producing variably shaped writing spots for electron lithography", published in Journal Vac. Sci. Techn. 15(3), May–June 1978, pp. 891–895 by M.G.R.Thomson et al; hereinafter referred to as the Thomson article. This article describes an electron beam exposure apparatus in which writing can be done, for example, with four spots by means of two composite beam bounding diaphragms which are imageable one on the other. In the apparatus described the four square spots are in alignment and can be activated independently of each other by an adapted shape of the second diaphragm and a correct superposition.

As compared with the original beam shaper as described in U.S. Pat. No. 3,638,231, patterns can be written more quickly with a structure suitable for that purpose. However, this does not apply to all patterns and certainly not to patterns in which an orthogonal and linear structure has been departed from. In general, and in particular for non-orthogonal or non-linear patterns, such a beam shaping system has too little flexibility and as a result of this often is too slow.

For an apparatus for, for example, the production of integrated circuit elements operating with a beam of charged particles it is desirable, irrespective of the fact whether the production takes place directly or via a mask, that the enlargement, the focus and the position of the source image on the object do not vary when the beam cross-section varies, otherwise the angular aperture of a final lens in the system would be restricted. In particular with direct production, such an apparatus must be quick in operation for which purpose a cross-section of the writing spot adapted optimally to the pattern and short writing pulse switching times are desired. Furthermore, it is of importance that aberrations in the system, for example, spherical aberrations, Boersch effects, trajectory displacement effects and scattered radiation should be reduced as much as possible.

SUMMARY OF THE INVENTION

It is an object of the invention to avoid the above-mentioned disadvantages and to mitigate the imposed requirements to a considerable extent. For that purpose a charged particles exposure device of the type mentioned in the opening paragraph is characterized according to the invention in that, viewed from the source, an optical system for an astigmatic source image is incorporated after a beam-bounding diaphragm so as to extend longitudinally in one direction in a plane in which a power field can be generated by a multipole element which at the area is active only in a direction transverse to the elongate source image.

Since an astigmatic optical system is used in an apparatus according to the invention for beam deformation, a beam deflection in one direction can be carried out without the source position being influenced and a preceding beam-bounding diaphragm can be deformed in one direction arbitrarily to a considerable extent without lack of definition occurring in the diaphragm image.

In a preferred embodiment the optical system is designed to form both an astigmatic source image and an elongate astigmatic image of a beam-bounding diaphragm directed transversely thereto between two beam-bounding diaphragms, and at the area of each of these images a multipole element is incorporated which is active only in one direction. The location of mechanical components of the multipole element is not relevant so long as a power field to be generated thereby is active in the plane of symmetry. In particular the polarity of the optical system can be reversed between two mutually perpendicular imaging directions. By using an optical system having a comparatively large depth of definition, images of the astigmatic source image can be deformed without edge blurring.

In particular the optical source is designed so that an astigmatic source image and an astigmatic diaphragm image directed transversely thereto coincide in one plane and for that purpose it may be constructed from quadrupoles, spherical lenses and or cylindrical lenses.

In a preferred embodiment the optical system is constructed from at least six quadrupoles and a multipole element is arranged in a plane of symmetry thereof in which, in addition to an image in a first direction (the x-direction) of a source, simultaneously an image of a diaphragm in a direction transverse thereto (the y-direction) can be realised. The source image is not deformed with the multipole arranged there which is active only in the x-direction, but two oppositely located boundaries of a beam-bounding diaphragm which is, for example, rectangular can be deformed more or less arbitrarily. By a subsequent image of said deformed diaphragm on a second beam-bounding diaphragm, writing spots can thus be deformed two sides of which are deformed arbitrarily. By incorporating a second quadrupole after a next beam-bounding diaphragm two oppositely located sides thereof can also be deformed and in superposition a writing spot having four boundaries to be formed arbitrarily can be formed. Non-linear deformations can also be realised, for example, arcs of a circle, by means of a sextupole as a multipole element.

In a further preferred embodiment, an astigmatically operating beam corrective system has been incorporated for a first quadrupole system with which non-desired astigmatic source deformations by the multipole can be precompensated. A simple assembly is obtained by using quadrupoles also for this purpose. In a multibeam system such a precompensation system is extremely desirable because otherwise the correct mutual location of the partial beams would be lost. In general it may be noted that it is favourable for rapidly controllable optical elements to use exclusively electrostatically operating elements in particular to be able to realise short setting times.

BRIEF DESCRIPTION OF THE DRAWING

A few preferred forms of the invention will now be described in greater detail hereinafter with reference to the drawing figures in which.

DESCRIPTION OF THE PREFERRED EMBODIMENTS

Figure 1:
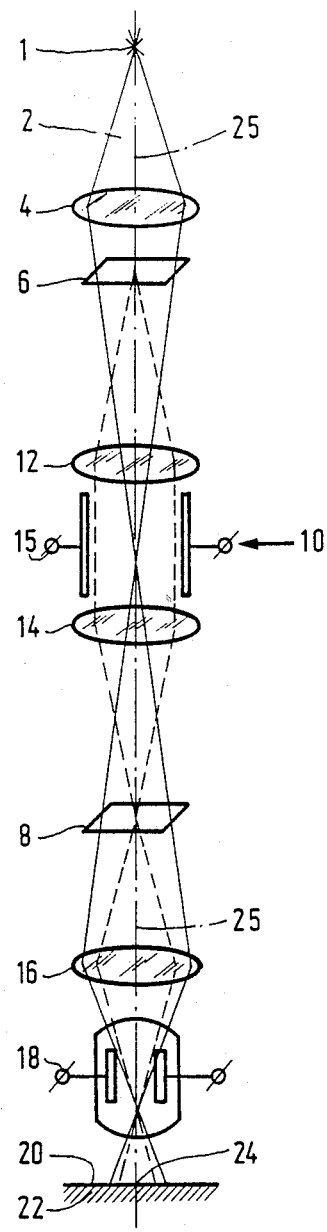
FIG. 1 shows a conventional beam shaping system.

For illustration FIG. 1 shows diagrammatically a known beam shaper. Such an apparatus comprises a source 1 of charged particles for generating an electron beam or ion beam 2. Although the control of electrons and ions differs considerably as a result of the great difference in the ratio mass-charge, lens system for both types of particles are fundamentally equal to a considerable extent. Proceeding along the beam 2 there are provided a condensor lens 4, a first beam-bounding diaphragm 6 and a second beam-bounding diaphragm 8 having therebetween a beam deflection system 10 comprising a first imaging lens 12, a second imaging lens 14 and a beam deflector 15. The second diaphragm 8 is conventionally succeeded by a final lens 16 and a scanning system 18 with which an image of the beam in the form of a writing spot 24 can be formed on a surface 20 of an object 22 with which spot the surface can be scanned and worked. The object 20 may be, for example, a slice of silicon for the direct formation of an integrated circuit element or chip or may be a mask sheet on which a mask for subsequent chip production can be written. The invention may be applied to both production methods but may be used in particular in the direct production of more complicated chips as a result of the considerable reduction in the number of necessary writing pulses. By moving an image of the first diaphragm over the real second diaphragm a beam section can be formed having a cross-section which is given by the superposition of the two diaphragms which are usually rectangular and the sides of which coincide with an x and y direction transverse to the optical z axis 25 of the apparatus. In this manner, by means of two such diaphragms and movement along the x axis or the y axis, strips can be formed in the directions and smaller rectangles can be formed by movement in both directions. The four-spot mentioned in the Thomson article is formed by the superposition of a rectangular diaphragm having a circumference of exactly the four spots in a row and a composite diaphragm having four different passages in four mutually shifted positions. As in the original beam shaper the geometry of the writing spot thus is determined entirely by the mechanical shape of the two beam-bounding diaphragms.

A beam shaper according to the invention, in an embodiment as is shown in FIG. 2, comprises again a source 1 for generating a beam of charged particles extending along the z-axis 25, a condensor lens 4, a first beam-bounding diaphragm 6, a second beam-bounding diaphragm 8, and a final lens 16 with a scanning system 18 for working a surface 20 of an object 22 by means of a writing spot 24. After the first diaphragm 6 a first quadrupole lens system 26 is incorporated which in this case comprises six quadrupoles 28 and 29. Optically such a system shows a plane of symmetry 30 between a third and a fourth quadrupole. At the area of the plane of symmetry 30 a multipole element 32 is incorporated. In like manner, after the second diaphragm a second quadrupole system 34 with quadrupoles 36 and 37, a plane of symmetry 35 and a multipole element 38 may be incorporated. Such a system is used in apparatus having two quadrupole systems, the second active in a direction transverse to the direction of activity of the first quadrupole lens element 26. Apart from the processing of the x and y axes the operation in quite analogous and will be described in greater detail with reference to FIG. 3. An astigmatic source correction system 40 which precompensates for astigmatic source deformation by one of the two multipole elements may be incorporated between the first diaphragm 6 and the source as a result of which, for example, in multibeam systems, a good, mutual beam registration is maintained. The beam correction system 40 may also be built up from, for example, three quadrupoles 42.

Figure 3:
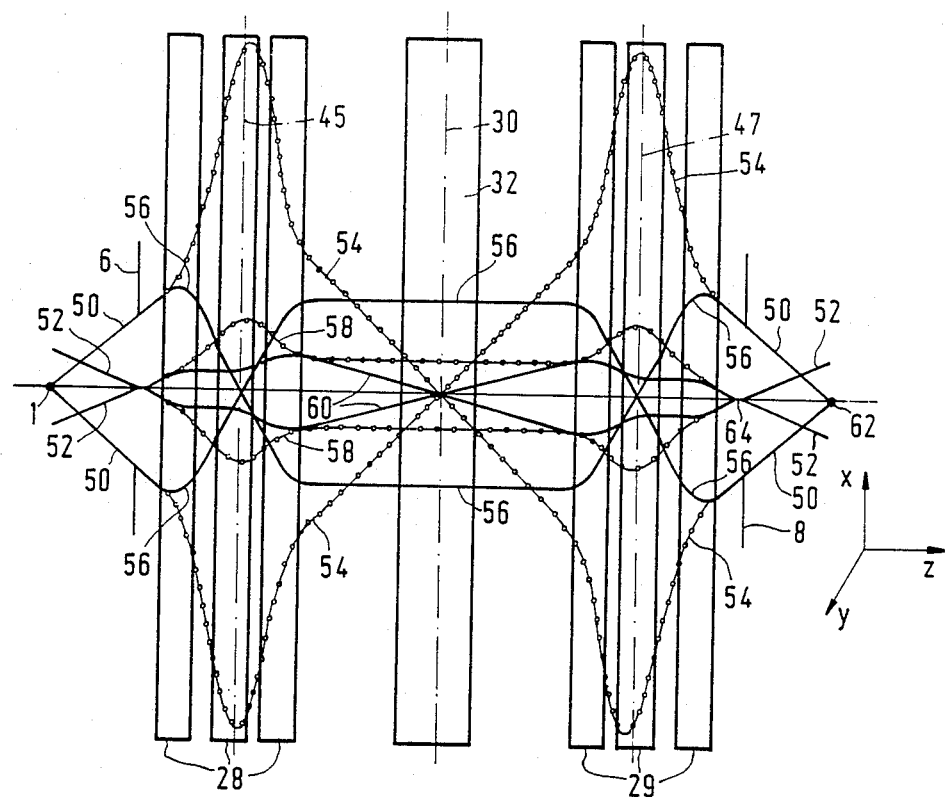
FIG. 3 shows an example of a path of radiation in the quadrupole lens system constructed from six quadrupoles.

FIG. 3 shows the path of radiation through a symmetric quadrupole lens system having six quadrupoles 28–29. By means of three quadrupoles 28 an astigmatic source image directed along an x-axis is formed in the plane of symmetry 30. An astigmatic source image directed along the y-axis is formed in a plane 45 and afterwards once again in a plane 47. This can be read from the path of radiation of which a source beam bounded by radiation lines 50 and a diaphragm beam bounded by radiation lines 52 are shown. The rays 50 are split in a path of radiation 54 in an x-y plane indicated by a dot-and-dash line and intersecting the z-axis system in the plane of symmetry 30 and thus forming an astigmatic source image in the x-direction, and a path of radiation 56 in an x-z plane indicated by a solid line in which points of intersection in the planes 45–47 correspond to astigmatic source images in the y-direction. The diaphragm beam-bounding rays 52 are split correspondingly into a path of radiation 58 in the y-z plane again indicated by a dot-and-dash line in which within the system no diaphragm image is formed, and in a path of radiation 60 in the x-z plane indicated by a solid line by which an astigmatic diaphragm image in the y-direction is formed in the plane of symmetry 30. After a last quadrupole the paths of radiation in both directions gather again into the paths of radiation 50 for the source, as a result of which a stigmatic source image 62 is formed, and into the path of radiation 52 for the diaphragm as a result of which, as described, a stigmatic diaphragm image 64 is formed at the area of the second diaphragm 8.

Figure 2:
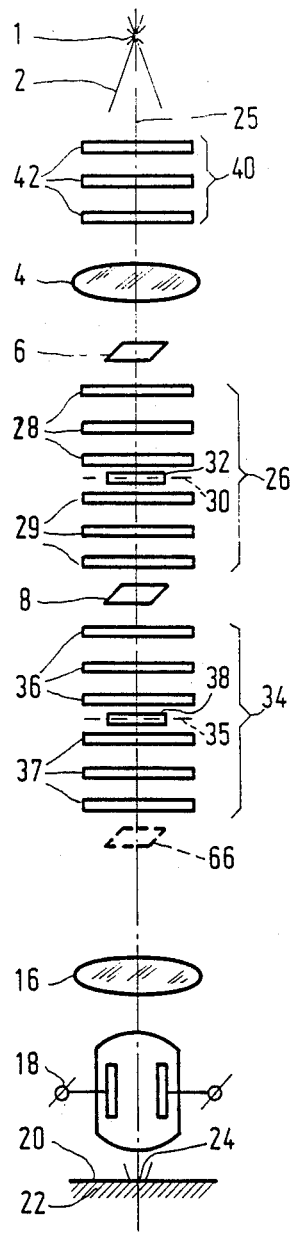
FIG. 2 shows diagrammatically an apparatus according to the invention.

A multipole element 32 placed in the plane of symmetry 30 and active only in the x-direction deforms the diaphragm image situated in the y-direction but does not affect the source image extending there in the x-direction. In this manner superpositions may be formed of an optically deformed image of a first diaphragm 6 and of a second diaphragm 8. Quite correspondingly superpositions can be formed after each other by means of two such systems of optically deformed images of a first diaphragm 6 and optically deformed images of a second diaphragm 8, for which purpose the broken-line diaphragm image location 66 is shown in FIG. 2.

Figure 4:
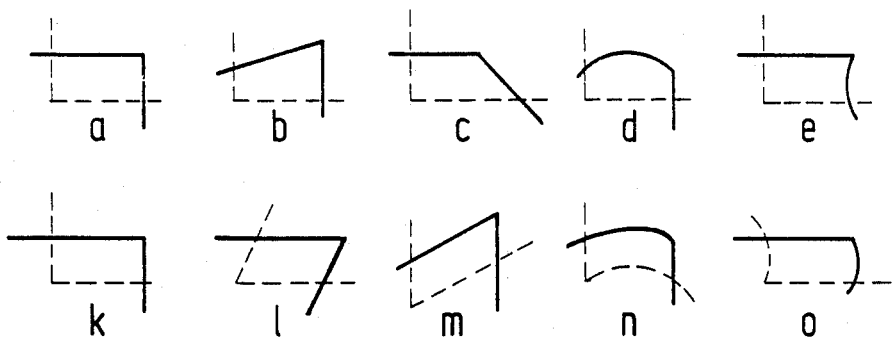
FIG. 4 and FIG. 5 show a few examples of writing spot cross-sections to be formed by means of an apparatus according to the invention.

FIG. 4 shows a few superpositions which can be realised. The geometries a and k are the conventional shapes realised by means of simple mechanical diaphragm super-position. The geometries b and c are formed by a single quadrupole system having a multipole element which also operates with a quadrupole field as a result of which a first diaphragm indicated by the solid lines is deformed linearly. The geometries d and e are formed with a single quadrupole system and a higher order multipole as a result of which non-linear deformations can be realised. The superpositions l and m are formed by means of two successsive quadrupole systems and for each a quadrupole as a multipole element, the superpositions n and o being formed by means of two successive quadrupole systems each having a higher order multipole, for example, a sextupole.

Figure 5:
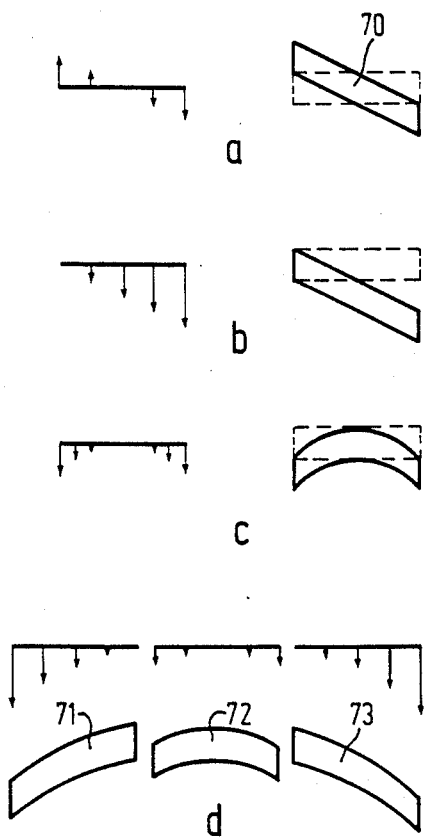

FIG. 5 shows the action of the multipole element for a single quadrupole system. In FIG. 5a the action is symmetrical with respect to the z-axis and is linearly increasing with the distance thereof as a result of which a superposition 70 which is so desired for inclined structures can be formed. FIG. 5b in fact shows the same action but this time non-symmetrical with respect to the z-axis. This is permissable because a shift of the field of the multipole element in the direction of the source image at the area does not cause imaging errors therefore. A non-linear symmetrical action indicated in FIG. 5c can be realised with, for example, a sextupole as a result of which superpositions with bent boundaries can be formed. By using symmetrical, non-linear actions and non-symmetrical non-linear actions, again permissible due to the permissible shift, circle segments 72 to be adapted to each other can be formed as is shown in FIG. 5d.

What is claimed is:

1. A charged particle exposure apparatus for exposing an object with a shaped beam of charged particles originating from a charged particle source, said apparatus including beam-shaping means comprising first and second beam-bounding diaphragms of predefined shapes and lens means disposed therebetween for imaging the first diaphragm onto the second diaphragm, characterized in that the lens means comprises, arranged along an axis, a lens system for forming in a first plane at a first position along said axis an astigmatic image of the source extending in a first direction, said lens system including a multipole element for producing in said first plane a power field which is active in said first plane only in a direction transverse to the first direction.

2. A charged particle exposure apparatus as in claim 1 where the lens system effects formation in a second plane at a second position along the axis an elongate astigmatic image of the first beam-bounding diaphragm extending in the first direction, and includes a multipole element for producing a power field which is active in said second plane only in a direction transverse to the first direction.

3. A charged particle exposure apparatus as in claim 1 or 2 including means for reversing the polarity of the lens system.

4. A charged particle exposure apparatus as in claim 1 or 2 where the lens system has a depth of definition which is sufficiently large to prevent edge blurring of astigmatic images found thereby.

5. A charged particle exposure apparatus as in claim 1 or 2 where the lens system also effects formation in the second plane of an astigmatic image of the source extending in the second direction.

6. A charged particle exposure apparatus as in claim 1 or 2 where the lens system includes quadrupole, spherical or cylindrical lenses.

7. A charged particle exposure apparatus as in claim 1 or 2 where each lens in the lens system comprises a quadrupole lens.

8. A charged particle exposure apparatus as in claim 2 where the lens system comprises at least six quadrupole lenses arranged along the axis and arranged symmetrically with respect to the second plane, and a multipole lens disposed at said second plane.

9. A charged particle exposure apparatus for exposing an object with a shaped beam of charged particles originating from a charged particle source, said apparatus including beam-shaping means comprising beam-bounding diaphragms of predefined shapes and lens means disposed therebetween for imaging one of the diaphragms onto another one of the diaphragms, characterized in that the lens means comprises, arranged along an axis:

a. a first lens system disposed between first and second ones of the diaphragms for forming in a first plane at a first position along said axis an astigmatic image of the source extending in a first direction, said first lens system including a multipole element for producing in said first plane a power field which is active in said first plane only in a second direction transverse to the first direction; and b. a second lens system disposed between the second and a third ones of the diaphragms for forming in a second plane at a second position along said axis an astigmatic image of the source extending in the second direction, said second lens system including a multipole element for producing in said second plane a power field which is active in said second plane only in the first direction.

10. A charged particle exposure apparatus as in claim 9 where:

a. the first lens system effects formation in a third plane at a third position along the axis an elongate astigmatic image of the first diaphragm extending in the first direction, and includes a multipole element for producing a power field which is active in said third plane only in the second direction; and b. the second lens system effects formation in a fourth plane at a fourth position along the axis an elongate astigmatic image of the second diaphragm extending in the second direction, and includes a multipole element for producing a power field which is active in said fourth plane only in the first direction.

11. A charged particle exposure apparatus as in claim 1 or 9 including astigmatic correction lens means disposed between the source and the first diaphragm.

12. A charged particle exposure apparatus as in claim 11 where the astigmatic correction lens means comprises a plurality of quadrupole lens.

13. A charged particle exposure apparatus as in claim 1 or 9 where the lens means includes a quadrupole lens element.

14. A charged particle exposure apparatus as in claim 1 or 9 where the lens means includes a sextupole lens element.

15. A charged particle exposure apparatus as in claim 1 or 9 where at least one multipole element has a number of poles which is sufficiently large to enable forming the beam to a substantially arbitrary shape.

* * * * *